US007656665B2

(12) United States Patent  
Lin et al.

(10) Patent No.: US 7,656,665 B2
(45) Date of Patent: Feb. 2, 2010

(54) INTEGRATED HEAT-DISSIPATING DEVICE FOR PORTABLE ELECTRONIC PRODUCT

(75) Inventors: Kuo-Len Lin, Wugu Township, Taipei County (TW); Chen-Hsiang Lin, Wugu Township, Taipei County (TW); Ken Hsu, Wugu Township, Taipei County (TW); Chih-Hung Cheng, Wugu Township, Taipei County (TW)

(73) Assignees: Golden Sun News Techniques Co., Ltd., Taipei (TW); CPUMATE Inc., Taipei (TW)

( * ) Notice: Subject to any disclaimer, the term of this patent is extended or adjusted under 35 U.S.C. 154(b) by 0 days.

(21) Appl. No.: 12/139,760

(22) Filed: Jun. 16, 2008

(65) Prior Publication Data

US 2009/0310307 A1 Dec. 17, 2009

(51) Int. Cl.
*H05K 7/20* (2006.01)
(52) U.S. Cl. ............ 361/700; 361/679.47; 361/679.52; 361/679.54; 361/679.55; 361/701; 165/80.2; 165/80.5; 165/104.21; 165/104.26; 165/104.33
(58) Field of Classification Search ......... 361/702–712, 361/714, 719, 721–724, 679.47, 679.52, 361/679.54, 679.55, 688; 165/80.2, 80.3, 165/80.4, 104.26, 104.33, 104.34, 185; 62/259.2; 29/832, 841, 854, 729, 739; 174/15.1, 16.3, 174/252; 257/713–722
See application file for complete search history.

(56) References Cited

U.S. PATENT DOCUMENTS 5,822,181 A * 10/1998 Jung ....................... 361/679.6

| 5,882,187 | A | * | 3/1999 | Gustafson et al. ............ 431/202 |
| 6,069,791 | A | * | 5/2000 | Goto et al. .............. 361/679.54 |
| 6,169,660 | B1 | * | 1/2001 | Sarraf et al. ................. 361/717 |
| 6,226,178 | B1 | * | 5/2001 | Broder et al. .......... 361/679.52 |
| 6,288,896 | B1 | * | 9/2001 | Hsu ...................... 361/679.54 |
| 6,507,488 | B1 | * | 1/2003 | Cipolla et al. .......... 361/679.52 |
| 6,752,201 | B2 | * | 6/2004 | Cipolla et al. ................ 165/121 |
| 6,771,498 | B2 | * | 8/2004 | Wang et al. ............. 361/679.47 |
| 6,813,153 | B2 | * | 11/2004 | Koning et al. ................ 361/700 |
| 6,816,371 | B2 | * | 11/2004 | Agata et al. ............ 361/679.27 |
| 6,900,990 | B2 | * | 5/2005 | Tomioka ...................... 361/752 |
| 7,116,552 | B2 | * | 10/2006 | Wu ........................ 361/679.26 |

* cited by examiner

*Primary Examiner*—Michael V Datskovskiy
(74) *Attorney, Agent, or Firm*—Chun-Ming Shih

(57) ABSTRACT

An integrated heat-dissipating device for a portable electronic product includes a heat-conducting base, a heat-dissipating plate, a first heat-dissipating module and a second heat-dissipating module. The heat-dissipating plate is adhered onto the heat-conducting base. The coefficient of heat conductivity of the heat-dissipating plate is larger than that of the heat-conducting base. The first heat-dissipating module includes a first heat pipe. One section of the first heat pipe is connected to the heat-conducting base, and the other section thereof extends in a direction away from the heat-conducting base. The second heat-dissipating module includes a second heat pipe, an adapting block and a third heat pipe. One section of the second heat pipe is connected to the heat-conducting base, and the other section thereof is connected to the adapting block. One section of the third heat pipe is connected to the adapting block, and the other section thereof extends in a direction away from the adapting block. With a multiple-directional heat-dissipating path, a great amount of heat generated by a heat-generating source can be dissipated to the outside quickly.

8 Claims, 7 Drawing Sheets

INTEGRATED HEAT-DISSIPATING DEVICE FOR PORTABLE ELECTRONIC PRODUCT

BACKGROUND OF THE INVENTION

1. Field of the Invention

The present invention relates to a heat-dissipating device, and in particular to an integrated heat-dissipating device for a portable electronic device.

2. Description of Prior Art

With the development of technology, portable electronic products have been widely used in our work or daily life, thereby increasing the working performance and the convenience in life. In order to make such a portable electronic device to be carried about easily, its volume and weight are reduced continuously. However, the operation speed of the portable electronic product is required increasing continuously, so that the amount of heat generated by an internal processor (i.e. CPU) is getting higher and higher. Conventionally, a heat-dissipating device comprising an aluminum-extruded heat sink and a fan is used to dissipate the generated heat. However, such a heat-dissipating device does not conform to the requirement for the heat dissipation. Therefore, it is necessary to develop a new technology to overcome the drawbacks of prior art.

The conventional heat-dissipating device for a portable electronic device includes a copper heat-conducting base and a heat-dissipating module. One surface of the heat-conducting base is adhered to a heat-generating source. The heat-dissipating module includes a heat pipe. One section of the heat pipe is adhered to the heat-conducting base, and the other end thereof extends in a direction away from the heat-conducting base to be adhered to a metallic casing of the electronic product. Via the metallic casing, the heat generated by the heat-generating source can be dissipated to the outside of the electronic product, thereby achieving the heat-dissipating effect.

However, in practice, the conventional heat-dissipating device of a portable electronic product still has some problems as follows. Since the heat dissipation is achieved by means of single path, the amount of heat transferred to the outside is so limited that it cannot satisfy the current demand of heat dissipation for the processor in a portable electronic product. Furthermore, since the heat-conducting base is made of copper, the material cost and weight thereof cannot be reduced efficiently. Therefore, it is an important issue to overcome the above-mentioned problems in prior art.

SUMMARY OF THE INVENTION

The present invention is to provide an integrated heat-dissipating device for a portable electronic product. With a multiple-directional heat-dissipating path being connected on the heat-conducting base, a great amount of heat generated by the heat-generating source can be dissipated to the outside quickly, thereby improving the heat-dissipating performance thereof greatly.

The present invention is to provide an integrated heat-dissipating device for a portable electronic product, which includes a heat-conducting base, a heat-dissipating plate, a first heat-dissipating module and a second heat-dissipating module. The heat-dissipating plate is adhered to one surface of the heat-conducting base. The coefficient of heat conductivity of the heat-dissipating plate is larger than that of the heat-conducting base. The first heat-dissipating module comprises a first heat pipe. One section of the first heat pipe is connected to the heat-conducting base, and the other section thereof extends in a direction away from the heat-conducting base. The second heat-dissipating module comprises a second heat pipe, an adapting block and a third heat pipe. One section of the second heat pipe is connected to the heat-conducting base, and the other section thereof is connected to the adapting block. One section of the third heat pipe is connected to the adapting block, and the other section thereof extends in a direction away from the adapting block.

The present invention is to provide an integrated heat-dissipating device for a portable electronic product. With the heat-conducting base being made of aluminum, the material cost and weight thereof can be reduced.

DETAILED DESCRIPTION OF THE INVENTION

The detailed description and technical contents of the present invention will be explained with reference to the accompanying drawings. However, the drawings are illustrative only, but not used to limit the present invention.

Figure 1:
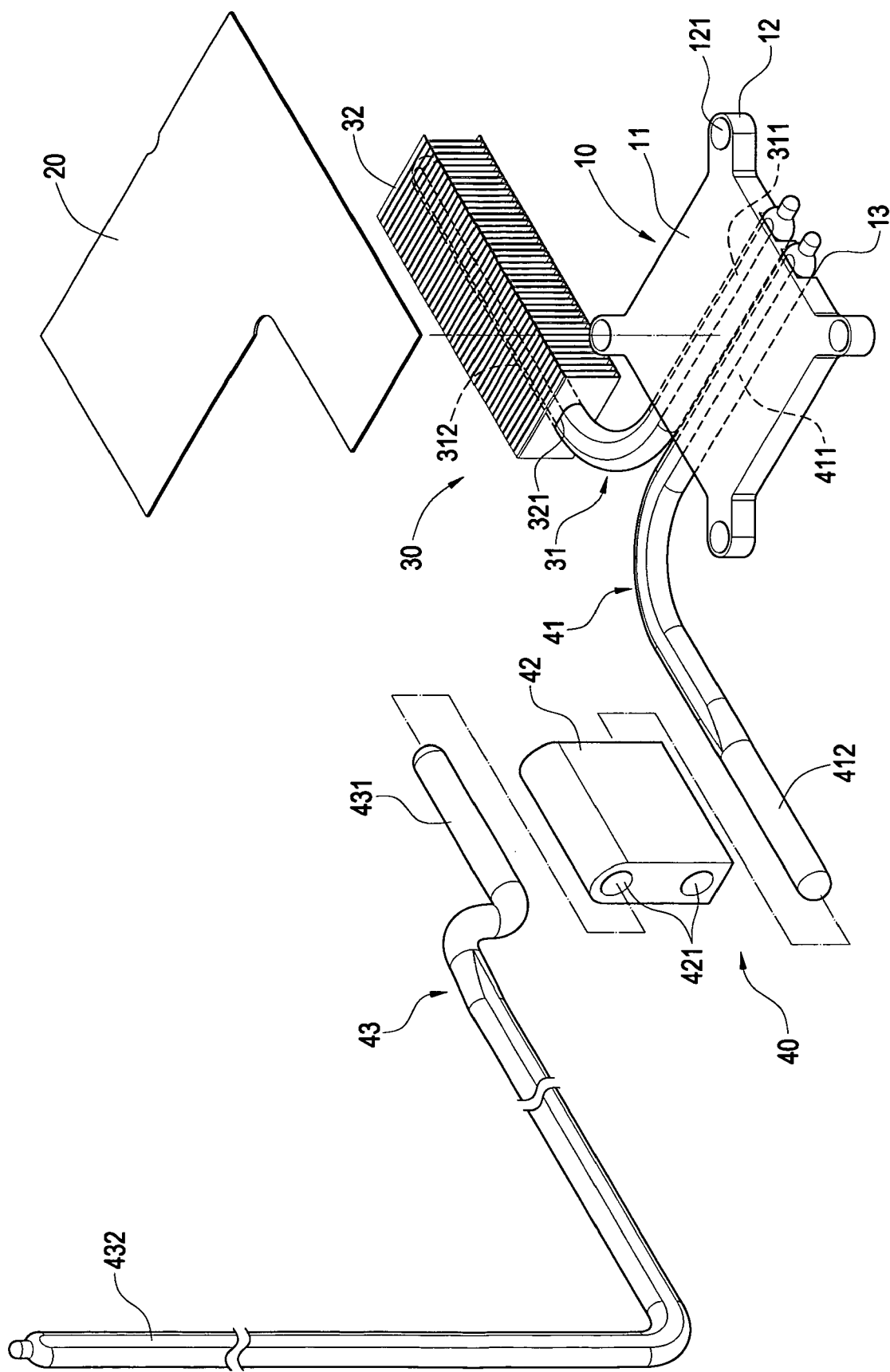
FIG. 1 is an exploded perspective view of the heat-dissipating device of the present invention.
Figure 2:
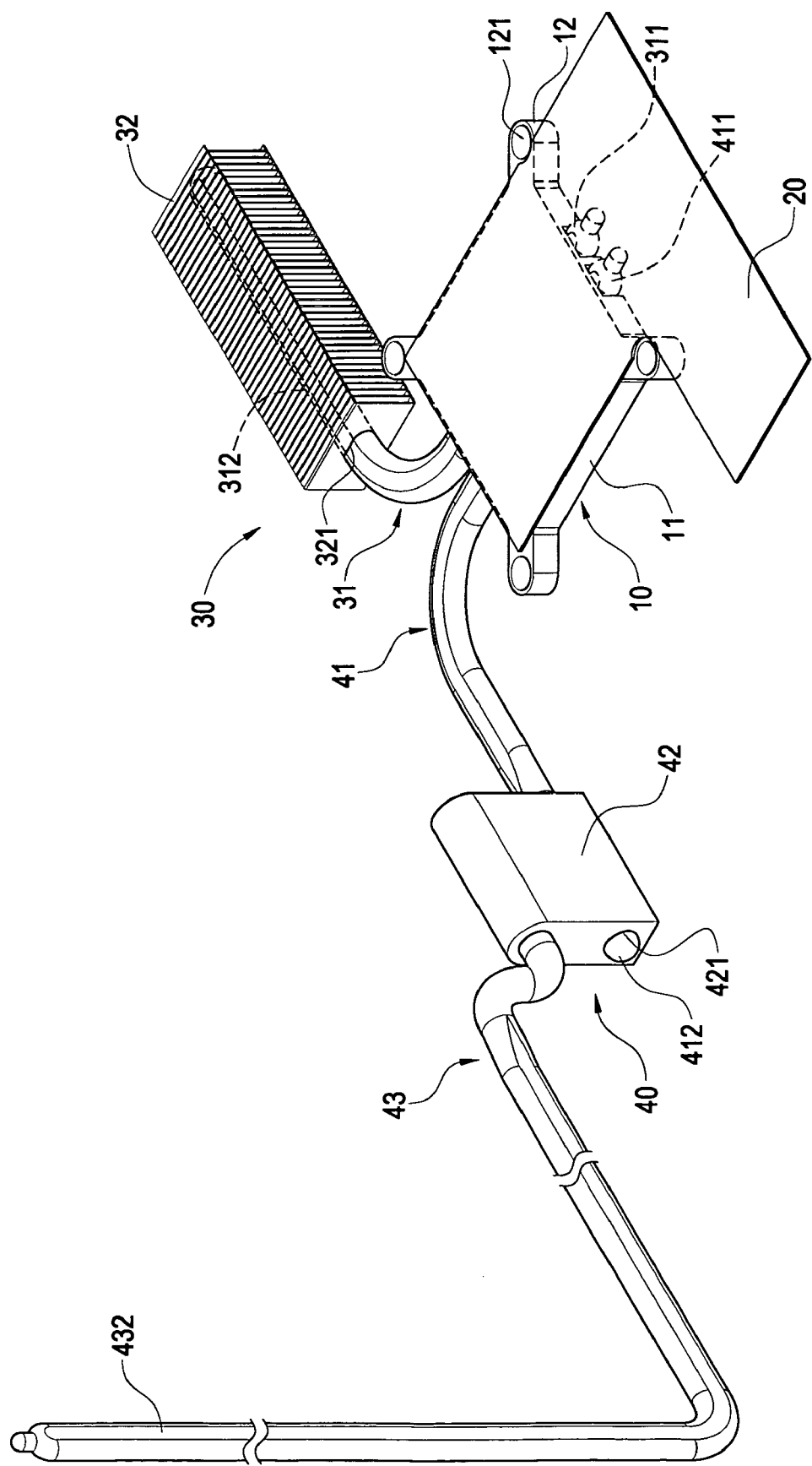
FIG. 2 is an assembled perspective view of the heat-dissipating device of the present invention.
Figure 3:
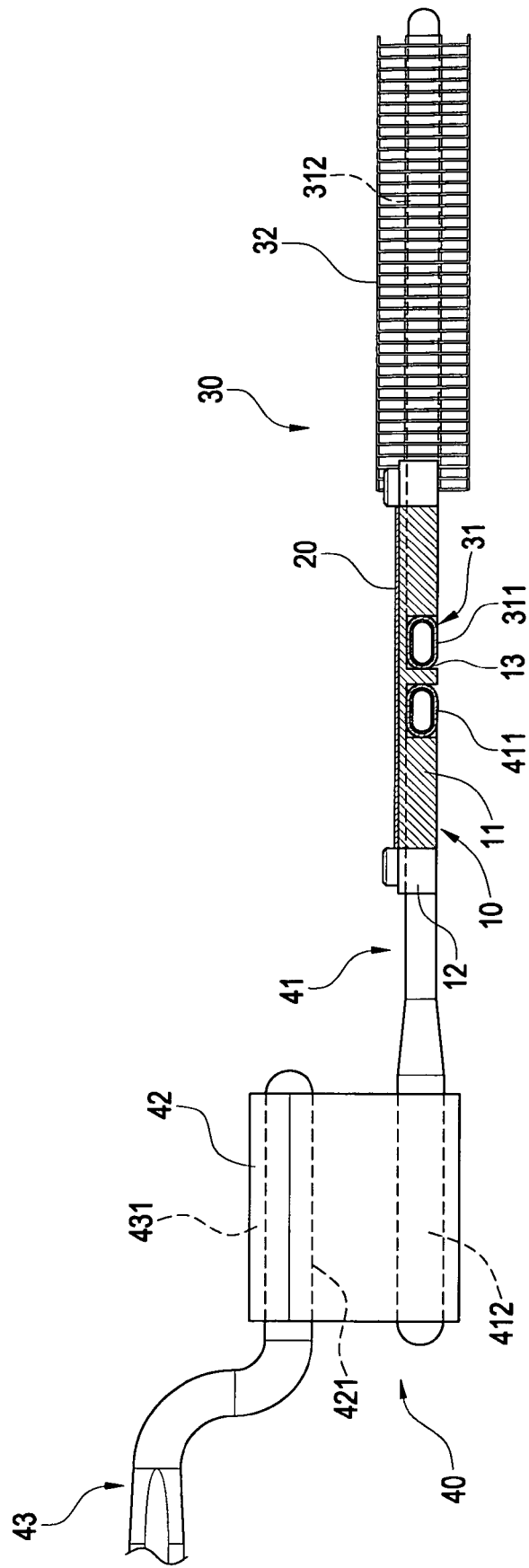
FIG. 3 is an assembled cross-sectional view of the heat-dissipating device of the present invention.

Please refer to FIGS. 1 to 3. FIGS. 1, 2 and 3 are an exploded perspective view, an assembled perspective view and an assembled cross-sectional view of the heat-dissipating device of the present invention respectively. The present invention provides an integrated heat-dissipating device for a portable electronic product for dissipating the heat generated by an electronic product 8 (FIG. 4) such as a notebook computer. The integrated heat-dissipating device includes a heat-conducting base 10, a heat-dissipating plate 20, a first heat-dissipating module 30 and a second heat-dissipating module 40.

The heat-conducting base 10 is made of a material having a large coefficient of heat conductivity (such as aluminum) and has a rectangular plate 11. Four corners of the rectangular plate 11 protrude to form an extension arm 12 respectively. Each extension arm 12 is provided with a positioning hole 121 for allowing a fastener or screw component (not shown) to be inserted therein. The bottom of the rectangular plate 11 is provided with two parallel grooves 13.

The heat-dissipating plate 20 is adhered on an upper surface of the heat-conducting base 10 and is made of a material having a large coefficient of heat conductivity (such as copper). The coefficient of heat conductivity of the heat-dissipating plate 20 is larger than that of the heat-conducting base 10. The area of the surface of the heat-dissipating plate is larger than that of an upper surface of the rectangular plate 11. Since a large area of the heat-dissipating plate 20 is brought into contact with the heat-conducting base 10, the heat-dissipating performance of the whole heat-dissipating device can be enhanced by the heat-dissipating plate 20.

The first heat-dissipating module 30 comprises a first heat pipe 31 and a plurality of heat-dissipating fins 32. The first heat pipe 31 is made flat and has a heat-absorbing section 311 and a heat-releasing section 312 extending from the heat-absorbing section 311. The heat-absorbing section 311 is received in one of the grooves 13. The bottom surface of the heat-absorbing section 311 is in flush with the bottom surface of the heat-conducting base 10. Furthermore, the heat-releasing section 312 extends in a direction away from the heat-conducting base 10. Each of the heat-dissipating fins 32 is provided with a through hole 321 respectively that corresponds to each other. The heat-releasing section 312 can penetrate a series of through holes 321, thereby dissipating the heat absorbed by the heat-absorbing section 311 quickly.

The second heat-dissipating module 40 comprises a second heat pipe 41, an adapting block 42 and a third heat pipe 43. Both the second heat pipe 41 and the third heat pipe 43 have a heat-absorbing section 411, 431 and a heat-releasing section 412, 432. The heat-releasing section 412 of the second heat pipe 41 extends in a direction away from the heat-conducting base 10. The heat-releasing section 432 of the third heat pipe 43 extends in a direction away from the adapting block 42. The heat-absorbing section 411 of the second heat pipe 41 is made flat and received in another groove 13. The bottom surface of the heat-absorbing section 411 is in flush with the bottom surface of the heat-conducting base 10. The adapting block 42 is made of a metallic material having good heat conductivity and is provided with two parallel through holes 421. The heat-releasing section 412 of the second heat pipe 41 is formed into a circular shape. The lower through hole 421 allows the heat-releasing section 412 to pass through. The heat-absorbing section 431 of the second heat pipe 43 is also made in a circular shape. The heat-absorbing section 431 is pivotally connected to the upper through hole 421 of the adapting block 42, so that the third heat pipe 43 can rotate with respect to the adapting block 42. Further, the heat-releasing section 432 of the third heat pipe 43 is also made flat and is adhered onto a casing 822 of the electronic product 8 (FIG. 4).

Figure 4:
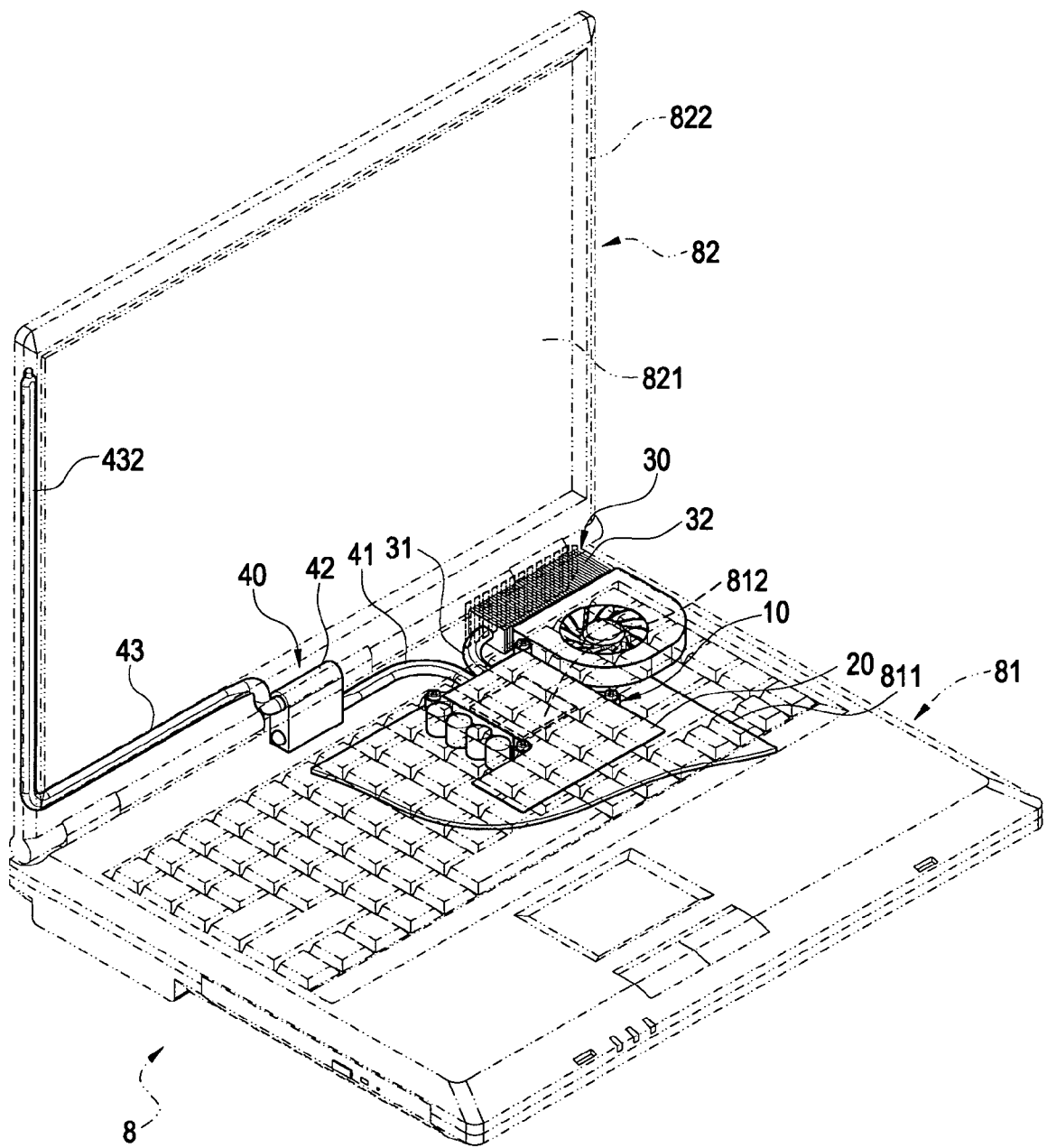
FIG. 4 is an assembled view showing the heat-dissipating device of the present invention being applied to a notebook computer.
Figure 5:
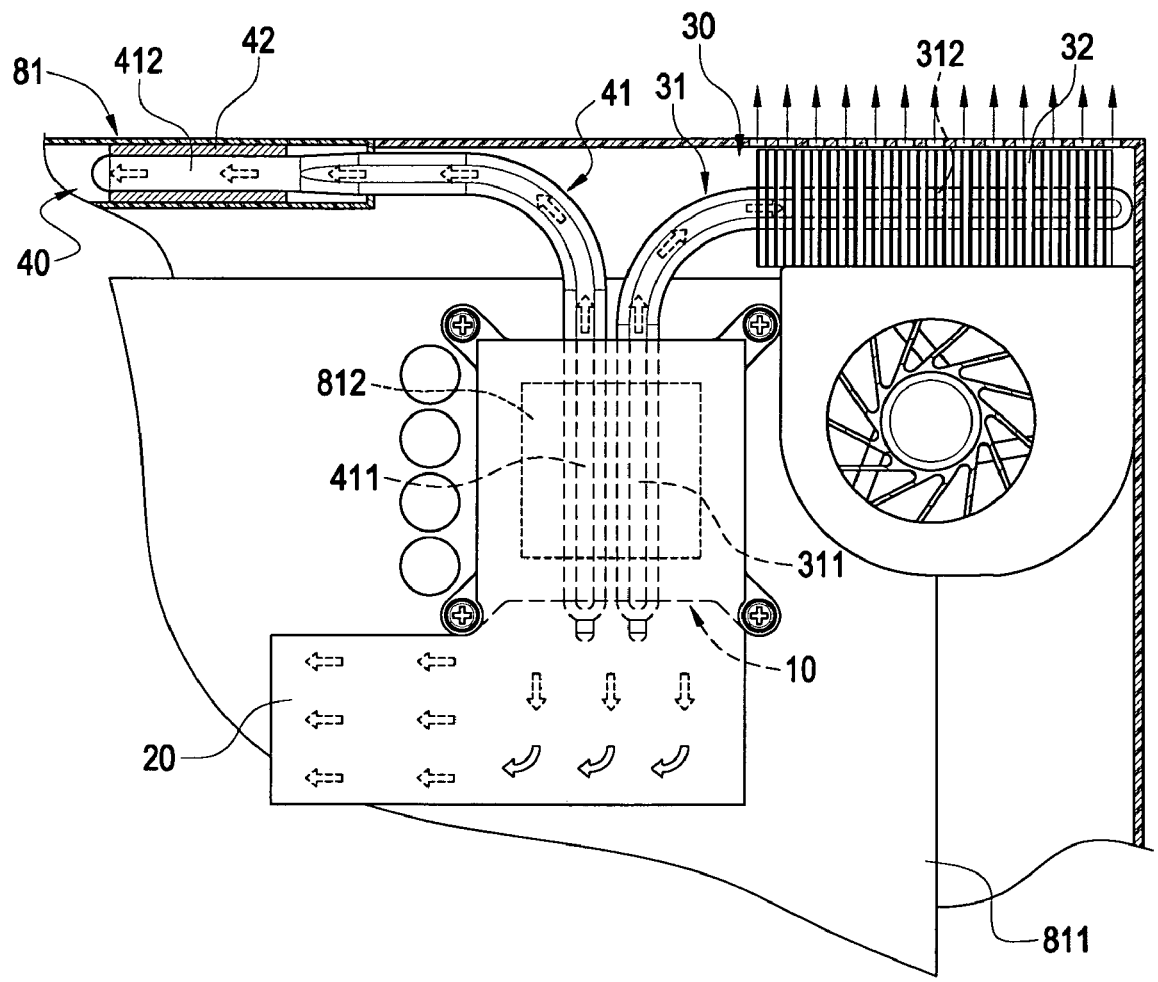
FIG. 5 is a partially enlarged cross-sectional view of FIG. 4.
Figure 6:
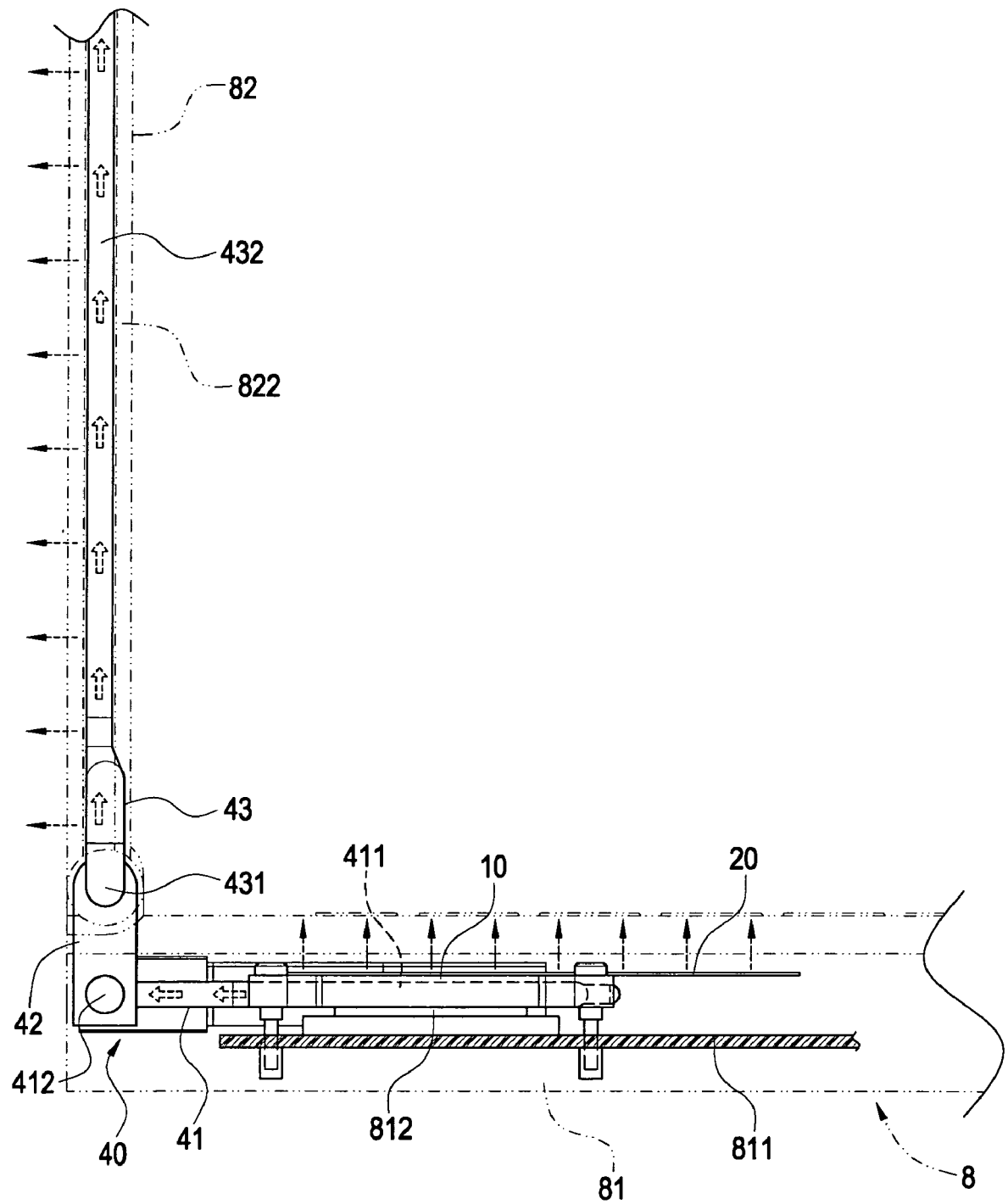
FIG. 6 is a partially enlarged cross-sectional view of FIG. 4 along another viewing angle.
Figure 7:
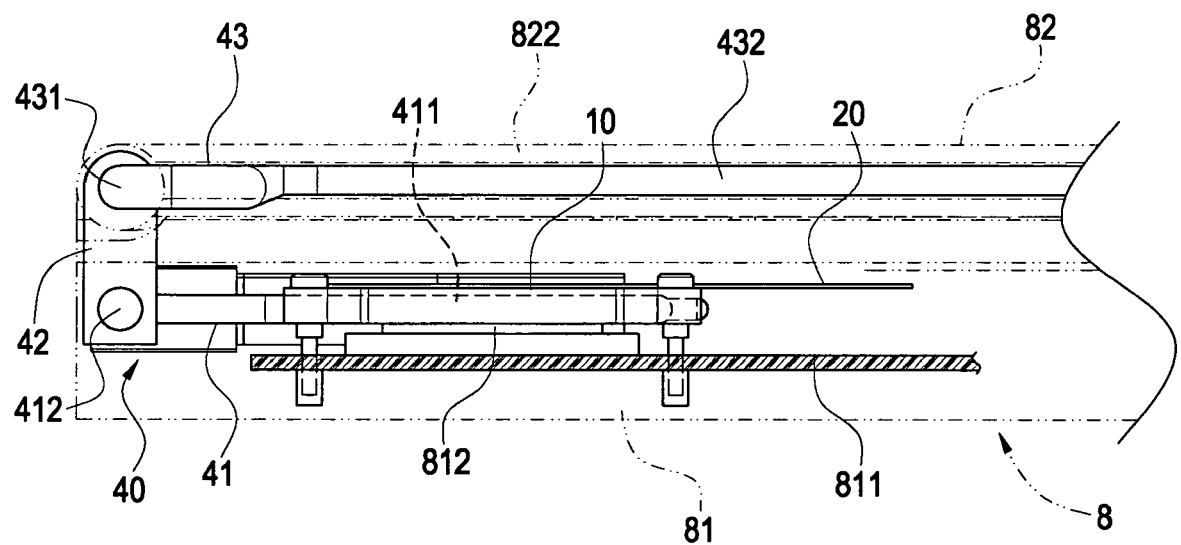
FIG. 7 is an assembled view showing a state after the cover in FIG. 6 covers downwardly.

Please refer to FIGS. 4 to 7. FIG. 4 is an assembled view showing the heat-dissipating device of the present invention being applied to a notebook computer. FIG. 5 is a partially enlarged cross-sectional view of FIG. 4. FIG. 6 is a partially enlarged cross-sectional view of FIG. 4 along another viewing angle. FIG. 7 is an assembled view showing the state after the cover in FIG. 6 covers downwardly. The heat-dissipating device of the present invention can be applied to a portable electronic product 8. In the present embodiment, the electronic product 8 is shown as a notebook computer, but it is not limited thereto. The electronic product 8 has a host 81 and a cover 82. The interior of the host 81 is provided with a circuit board 811. The circuit board 811 is mounted thereon with a central processor 812 or other different electronic elements or devices. The cover 82 has a display 821 and a metallic casing 822 sealed on the outer periphery of the display 821. In assembling, the heat-conducting base 10, the heat-absorbing section 311 of the first heat pipe 31, and the heat-absorbing section 411 of the second heat pipe 41 are brought into contact with the central processor 812 correspondingly (FIG. 5) and are fixed on the circuit board 811 by means of inserting bolts or fasteners into the positioning holes 121. The coefficient of heat conductivity of the heat-dissipating plate 20 is larger than that of the heat-conducting base 10, and the area of the peripheral surface of the former is larger than that of the latter. As a result, not only it is possible to avoid the electronic elements around the central processor 812, but also the heat generated by the central processor 812 can be conducted and dissipated. On the other hand, the heat-releasing section 312 of the first heat pipe 31 and each heat-dissipating fin 32 are received exactly in a predetermined space in the host 81 while a fan and heat-dissipating holes are provided around each heat-dissipating fin 32, so that the heat-dissipating process can be performed to each heat-dissipating fin 32 and the heat-releasing section 312 by means of compulsive airflow. Furthermore, the heat-releasing section 432 of the third heat pipe 43 is adhered on the casing 822 of the electronic product 8. The adapting block 42 is used to conduct the heat between the third heat pipe 43 and the second heat pipe 41. The heat generated by the central processor 812 can be conducted quickly from the second heat pipe 41, the adapting block 42 and the third heat pipe 43 to the metallic casing 822. The large heat-dissipating area of the metallic casing 822 is used to achieve a high heat-dissipating performance. In addition, since the third heat pipe 43 of the present invention is able to rotate with respect to the adapting block 42, the cover 82 can still cover the host 81 when the electronic product 8 is not in operation (FIG. 7).

According to the above, the integrated heat-dissipating device of a portable electronic product of the present invention already has industrial applicability, novelty and inventive steps. Furthermore the structure of the present invention has not been seen in products of the same kind or put into public use. Therefore, the present invention conforms to the requirements for an invention patent.

What is claimed is:

1. An integrated heat-dissipating device for a portable electronic product, comprising:

a heat-conducting base (10) having a plate (11); and a heat-dissipating plate (20) adhered on one surface of the heat-conducting base (10), a coefficient of heat conductivity of the heat-dissipating plate (20) being larger that of the heat-conducting base (10);

a first heat-dissipating module (30) comprising a first heat pipe (31), one section of the first heat pipe (31) being connected on the heat-conducting base (10) while the other section thereof extending in a direction away from the heat-conducting base (10); and a second heat-dissipating module (40) comprising a second heat pipe (41), an adapting block (42) and a third heat pipe (43), one section of the second heat pipe (41) being connected to the heat-conducting base (10), while the other section thereof extending in a direction away from the adapting block (42), wherein the bottom of the plate (11) is provided with a groove (13) for receiving therein the first heat pipe (31), and the bottom surface of the first heat pipe (31) is in flush with the bottom surface of the heat-conducting base (10), and wherein the bottom of the plate (11) is provided with another groove (13) parallel to the groove (11), thereby receiving therein the second heat pipe (41), and the bottom surface of the second heat pipe (41) is in flush with the bottom surface of the heat-conducting base (10).

2. The integrated heat-dissipating device for a portable electronic product according to claim 1, wherein the plate (11) is made of aluminum.

3. The integrated heat-dissipating device for a portable electronic product according to claim 1, wherein an area of a surface of the heat-dissipating plate (20) is larger than that of the plate (11).

4. The integrated heat-dissipating device for a portable electronic product according to claim 1, wherein the heat-dissipating plate (20) is made of copper.

5. The integrated heat-dissipating device for a portable electronic product according to claim 1, wherein the adapting block (42) is provided with a through hole (421) for allowing the other section of the second heat pipe (41) to pass through.

6. The integrated heat-dissipating device for a portable electronic product according to claim 5, wherein the adapting block (42) is provided with another through hole (421) parallel to the through hole (421), thereby allowing one section of the third heat pipe (43) to pass through, so that the second heat pipe (42) is able to rotate with respect to the adapting block (42).

7. The integrated heat-dissipating device for a portable electronic product according to claim 1, wherein the adapting block (42) is provided with a through hole (421) for allowing one section of the third heat pipe (43) to pass through, so that the third heat pipe (43) is able to rotate with respect to the adapting block (42).

8. The integrated heat-dissipating device for a portable electronic product according to claim 1, wherein the first heat-dissipating module (30) comprises a plurality of heat-dissipating fins (32), each of the heat-dissipating fins (32) is provided thereon with a through hole (321) corresponding to each other, and the other section of the first heat pipe (31) is inserted into these through holes (321).

\* \* \* \* \*